(12) United States Patent
Hublitz et al.

(10) Patent No.: US 8,879,228 B2
(45) Date of Patent: Nov. 4, 2014

(54) ELECTRONIC SAFETY DEVICE

(75) Inventors: Dieter Hublitz, Niederwerrn (DE);
Alwin Hummel, Winkelhaid (DE);
Anton Schneider, Nürnberg (DE);
Harald Schweigert, Vienna (AT)

(73) Assignees: Siemens Aktiengesellschaft, Munich (DE); Siemens AG Oesterreich, Vienna (AT)

( * ) Notice: Subject to any disclaimer, the term of this patent is extended or adjusted under 35 U.S.C. 154(b) by 57 days.

(21) Appl. No.: 13/582,660

(22) PCT Filed: Feb. 3, 2011

(86) PCT No.: PCT/EP2011/051558
§ 371 (c)(1),
(2), (4) Date: Sep. 4, 2012

(87) PCT Pub. No.: WO2011/107314
PCT Pub. Date: Sep. 9, 2011

(65) Prior Publication Data
US 2013/0003241 A1    Jan. 3, 2013

(30) Foreign Application Priority Data

Mar. 2, 2010 (AT) .................................. A 316/2010

(51) Int. Cl.
*H02H 3/00* (2006.01)
*H03K 17/082* (2006.01)
*H03K 17/14* (2006.01)
*H03K 17/08* (2006.01)

(52) U.S. Cl.
CPC ...... *H03K 17/082* (2013.01); *H03K 2017/0806* (2013.01); *H03K 17/14* (2013.01)
USPC .............................................. 361/103; 361/72

(58) Field of Classification Search
USPC .................................. 361/103, 93.7–93.9, 72
See application file for complete search history.

(56) References Cited

U.S. PATENT DOCUMENTS

| 5,737,169 | A | 4/1998 | Sellers |
| 5,898,557 | A | 4/1999 | Baba |
| 6,845,022 | B2 * | 1/2005 | Yoshimura et al. ............. 363/95 |
| 7,538,508 | B2 * | 5/2009 | Kuivalainen et al. ......... 318/471 |
| 2004/0246043 | A1 | 12/2004 | Maeda |
| 2006/0221527 | A1 | 10/2006 | Jacobson |
| 2007/0284664 | A1 | 12/2007 | Michinaka |

FOREIGN PATENT DOCUMENTS

| CN | 1550947 | 12/2004 |
| DE | 19923569 A1 | 11/2000 |
| DE | 20109687 U1 | 10/2002 |
| DE | 202005001650 U1 | 5/2005 |
| DE | 10357250 A1 | 7/2005 |
| DE | 112004001969 T5 | 9/2006 |
| JP | 10-51944 | 2/1998 |

* cited by examiner

*Primary Examiner* — Danny Nguyen
(74) *Attorney, Agent, or Firm* — Cozen O'Connor

(57) ABSTRACT

A method and electronic safety device including a switching element for disconnecting and/or limiting the current consumption of an electrical load, wherein control commands for the switching element are received through a remote control interface, and wherein the switching element is only switched on or off when the thermal load on the switching element is within a permissible range such that there is no longer any need to provide a dedicated relay in electrical systems for remote-controlled switching operations.

13 Claims, 2 Drawing Sheets

ELECTRONIC SAFETY DEVICE

CROSS-REFERENCE TO RELATED APPLICATIONS

This is a U.S. national stage of application No. PCT/EP2011/051558 filed 3 Feb. 2011. Priority is claimed on Austrian Application No. A316/2010 filed 2 Mar. 2010, the content of which is incorporated herein by reference in its entirety.

BACKGROUND OF THE INVENTION

1. Field of the Invention

The invention relates to an electronic safety device including a switching element for disconnecting and/or for limiting the current consumption of an electrical load, and a method for operating the electronic safety device.

2. Description of the Related Art

Electrical safety devices are utilized wherever malfunctions within an electrical plant can endanger personnel and/or machines. The use of electronic safety devices is particularly customary in industrial plants. Here, a plurality of branch load circuits is frequently supplied by one power supply. Each branch load circuit contains one or more loads, where it is usually possible for each of these branch load circuits to be protected by an electronic safety device at the respective output of the power supply. In the event of a malfunction, currents through a branch load circuit are limited and in the case of a prolonged fault, the affected branch load circuit is disconnected. In this case, in comparison to a conventional fuse, the current limiting function of an electronic safety device offers the advantage that inrush currents of loads can be limited if necessary, even in regular operation.

With the increasing use of switched-mode power supplies as power supply units, with their precise current limiting and unambiguous detection of defective loads, electronic safety devices are being used in increasing numbers. In the event of a load short-circuit, the dip in the supply voltage is prevented by using an electrical safety device to actively limit the short-circuit current.

Apart from protecting each branch load circuit, there is often the need to temporarily disconnect individual branch load circuits. The reasons for this are, for example, maintenance operations or simply energy saving measures. In the majority of cases, however, these involve operational control of various loads (for example, solenoid valves, contactor coils or servomotors).

In the case of energy saving measures, individual branch load circuits are disconnected if the corresponding sections of the plant are not required. It should be noted here that the operating states of the entire plant and of the individual sections of the plant are always clearly defined to ensure a smooth start-up at any time.

In accordance with the prior art, relays and contactors are used to disconnect and connect individual branch load circuits. High inrush currents due to capacitive loads are capable of damaging or destroying a relay or contactor. It is therefore sensible to connect such a switching relay downstream of an electronic safety device. The electronic safety device then acts as a monitoring unit and operates to limit current surges in the course of a starting cycle. Here, the electronic safety device operates in a linear mode until the current again falls below a permissible maximum limit.

As a consequence of this inrush current limiting, lower-rated switching relays can be employed and the life of the switching contacts is significantly increased.

SUMMARY OF THE INVENTION

It is an object of the present invention to provide an improved electronic safety device for use in industrial plants.

This and other objects and advantages are achieved in accordance with the invention by an electronic safety device and method for operating this safety device in which there is no need in electrical systems for a dedicated relay to be provided for remote-controlled switching operations. In addition, the combination of a plurality of safety channels in one safety device results in a smaller wiring outlay within a plant.

In accordance with the invention, control commands for the switching element are received via a remote control interface and the switching element is only switched on or off when the thermal load on the switching element is within a permissible range. In this way, it is possible to use the electronic safety device itself for switching individual branch loads on and off. The thermal load is taken into account because only one switch is provided for executing remote switching commands and if necessary for current limiting. The problems of an unduly high switching frequency of a switching relay are overcome. An unduly high switching frequency, for example, as a result of a programming fault, no longer leads to relay contact wear or sudden disconnection of the electronic safety device.

A central plant control system is usually installed within an industrial plant. The central plant control system controls the switching function of the electronic safety device via the remote control interface. The restriction that a switching command is executed only under permissible thermal conditions prevents damage to the electronic safety device. Particularly in industrial plants, this circumstance is highly significant because the failure of a safety device can cause the shutdown of the entire plant. Great importance is therefore attached to the fault tolerance of electronic safety devices in a large number of applications.

In an embodiment the invention, a message signal is generated if a switching command is not acted upon. An acknowledgement option at a central plant control system is therefore available. This prevents non-executed remote control commands due to thermally unsuitable conditions from causing malfunctions in a plant.

In a further embodiment, an acknowledgement signal is generated after each switching operation. Transmission of this acknowledgement signal to a plant control system increases the operational reliability of the plant. With complex plants, in particular, in order to ensure coordinated control of the entire plant, knowledge of the operating states of the individual branch loads is important. Troubleshooting is also simpler because fault localization by means of the central control system can be carried out automatically.

A simple embodiment of the invention is obtained when, following a switching operation or following a plurality of switching operations, a lock-out period is specified, during which no further switching operation can be performed. The length of the lock-out period is chosen so that, in all possible operating states, the permissible thermal loads of the safety components are not exceeded. A necessary cooling period for the switching element, plus a safety margin, is used as the default for the lock-out period. This ensures that adequate cooling occurs and a recent switching operation does not cause the permissible range of the thermal load of the switching element to be exceeded. Critical states can occur if, when connecting a branch load circuit, the switching element of the electronic safety device has to utilize a large part of its thermal capacity, has to connect loads in the current limiting mode or has to disconnect a large inductance when loaded by freewheel circuits.

An improved embodiment provides for the thermal load of the switching element to be determined and no switching operations are performed if the thermal load reaches a critical limit. A switching operation is blocked in accordance with the actual thermal load of the switching element. The thermal load is simply determined by measuring the temperature of the switching element.

Such a physical measurement process is not required if the thermal load is determined from calculated switching energy losses and/or transfer losses of the switching element. If the electronic safety device is in a linear mode, i.e., in a current-limiting operating state, the dwell time (or steady-state period) in this linear mode is determined first. Apart from this dwell time, the set safe limiting current is used for an approximate calculation of the switching energy losses. For a more accurate calculation, it is useful if the voltage drop across the switching element is also determined. An indication of the thermal load of the switching element of the electronic safety device can be obtained by generating the integral of at least one of the stated parameters.

A more precise calculation of the losses of the switching element can be realized if the voltage drop across the switching element and the current flowing through the switching element are measured. All the losses occurring in the switching element, as well as the switching energy losses and the transfer losses occurring in normal operation can be recorded with this method.

Advantageously, a cooling period during which no switching operations are performed is specified according to the established thermal load. At the same time, the thermal cooling is stored as a mathematical function in the controller of the electronic safety device, for example. A low load results in no cooling times or short cooling times, whereas a high thermal load results in longer cooling times.

In a particular embodiment, binary signals are communicated via the remote control interface. Communication between the electronic safety device and a master plant controller then occurs by simple binary states, for example. In this case one cable per function is provided between the electronic safety device and the plant controller. Alternately, communication can be realized via telegrams and binary states, which enables a plurality of signals or functions to be transmitted via a single conductor. In the case of a plurality of safety channels in one safety device, in particular, the wiring outlay is considerably reduced by signal bundling in the form of telegrams.

Moreover, telegram transmission enables the supplementary function, where the fuse tripping value of the electronic safety device can be specified by a master plant controller. As a result, a plant can be fine-tuned from a control center.

It is also an object of the invention to provide an electronic safety device including an electronic control unit and a switching element, where it is possible for a remote control interface to be provided to receive control commands for the switching element and it is also possible for the electronic control unit to trigger the switching element only when the thermal load of the switching element is within a permissible range.

A timer is located in one embodiment of the invention, by which a lock-out period is specified, during which no further switching operation may be implemented.

Furthermore, it is advantageous if the electronic safety device is configured to determine the thermal load of the switching element. An electronic safety device usually contains a microcontroller anyway. As a result, it is convenient if this is provided to calculate switching energy losses.

Finally, it is advantageous if an operator control element is provided, by which at least one function of the electrical safety device can be manually retrieved. Above all, this is useful for maintenance operations and for commissioning purposes.

A further embodiment makes provision for electronic safety devices to be arranged in parallel and interconnected according to the daisy chain method. Thus, each safety device or a plurality of safety devices combined in a group has a communications input and a communications output. Plant control signals are transmitted to one safety device or a group of safety devices and retransmitted from safety device to safety device. Messages are likewise transmitted via one safety device or a group of safety devices to the central plant control system. Consequently, a defective safety device can be replaced without requiring a modification to a program or address.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Exemplary embodiments of the electronic device and method in accordance with the invention will be explained below by using the drawings, in which.

DETAILED DESCRIPTION OF THE PREFERRED EMBODIMENTS

In the majority of automation systems, DC voltages are used for supplying a plant control system and its peripherals. A global 24 V DC voltage standard has been established and employed for many years. This voltage is available as a control voltage. In many plants this control voltage can also be a 230 V AC voltage or any other voltage. In this case, the frequency of an AC voltage can be determined for specific plants. The invention relates to a wide variety of different supply systems, but in particular to safety devices for DC voltage systems, because these occur most frequently.

Figure 1:
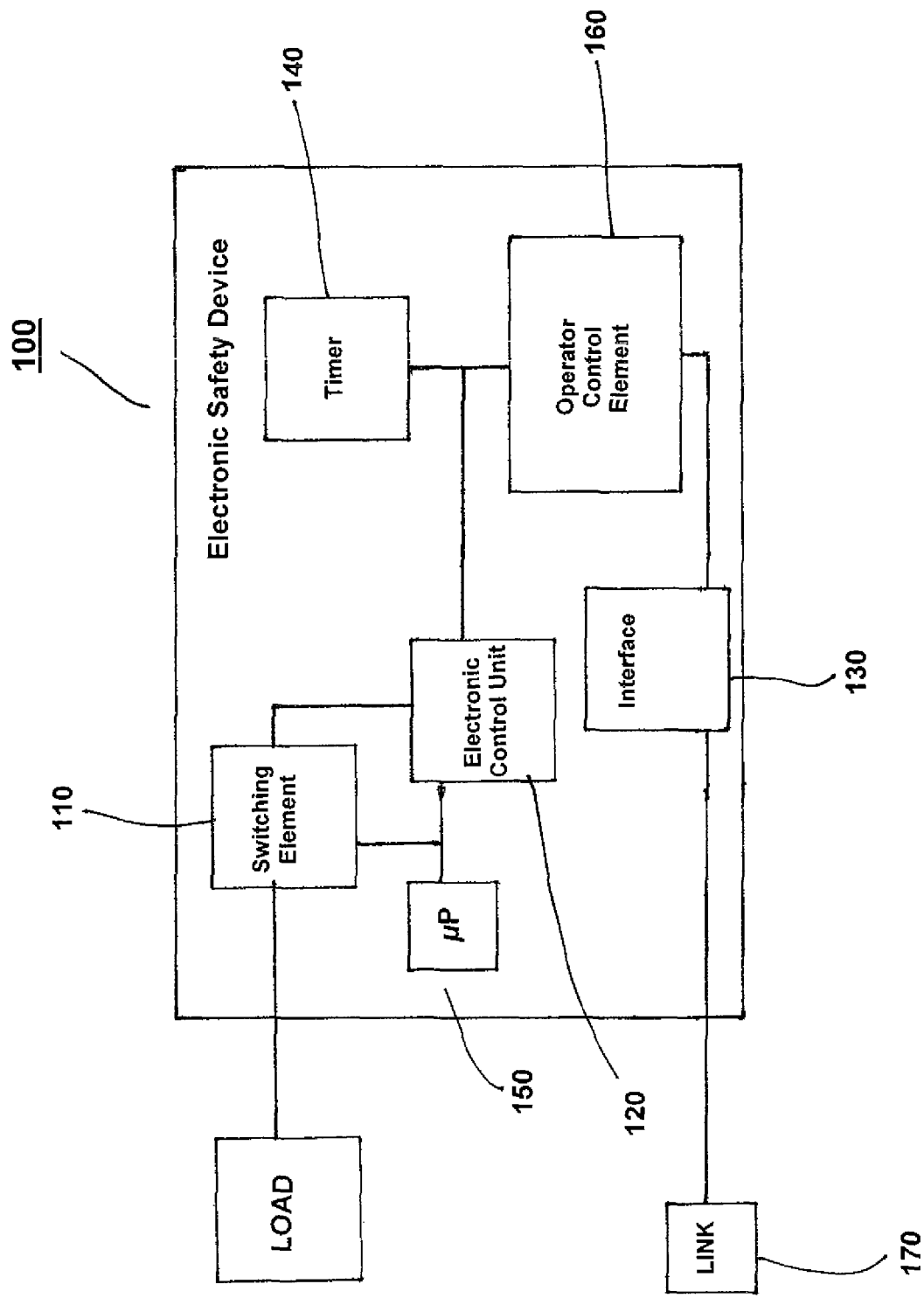
FIG. 1 is a schematic block diagram of the electronic device in accordance with the invention.

FIG. 1 is a schematic block diagram of the electronic safety device in accordance with the invention. The electronic safety device 100 includes an a switching element 110 and an electronic control unit 120, where a remote control interface 130 is provided for receiving control commands for the switching element 100, where it is possible for the electronic control unit 120 to trigger the switching element 110 only when the thermal load of the switching element 110 is within a permissible range.

In an embodiment, the electronic safety device 100 includes a timer 140 by which a lock-out period is specified, during which no further switching operation may be implemented. The electronic safety device 100 is advantageously configured to determine the thermal load of the switching element 110 using a microcontroller 150 that calculates switching energy losses. An operator control element 150 is advantageously provided in the electronic safety device 100. The operator control element 160 allows the manual retrieval of at least one function of the electrical safety device 100, which is useful for maintenance operations and for commissioning purposes. In accordance with disclosed embodiments, the electronic safety device is further configured to connect to a daisy chain communications link 160 for relaying switching commands and messages one of to a plurality of safety devices and from a plurality of safety devices.

In the following, reference is principally made to a 24 V DC distribution system. In the case of industrial plants, power supplies are usually used which produce a 24 V DC control voltage from a 230 V or 400 V supply voltage. These power supplies can be designed as unregulated (mostly 50 Hz transformers with rectifiers) or regulated (mostly switched-mode power supply units).

With specific reference to FIG. 1, the control of an industrial plant is realized by a central controller, such as a Siemens SIMATIC. The advantage of the present invention comes in useful, in particular when this master plant control system is connected to the electronic safety device 100 in accordance with the invention for connecting and disconnecting the corresponding branch load circuit.

Known standard solutions can be used for the transmission of a switching command. For example, a transmission channel of the electrical safety device is connected to a digital output of the master plant control system by a dedicated line. Either a simple on/off signal is transmitted or defined, individual switching channels of a multi-channel electronic safety device are addressed by a telegram. The electronic safety device can also be connected via any standardized data bus network (for example, Profinet).

Above all, connection to branch load circuits, i.e., switching on corresponding loads, causes thermal loading of the switching element 110 within the electronic safety device 100. The magnitude of the thermal load depends on the characteristic of the respective load. An inrush current is particularly large when loads having a high capacitive component are involved. When the switching element 110 is closed, the current is now limited to a greater extent by the parasitic resistances of conductors and connecting terminals, by the internal resistances of the output capacitors of a power supply, and by the internal resistances of load capacitors.

The switching element 110 is heavily loaded if, in particular, the loads have starting currents which are appreciably higher than the currents during continuous operation. Without suitable measures, this would lead to overloading of the power supply and consequently to an excessive sag in the supply voltage. An electrical safety device 100 is therefore set up for linear current limiting. In this case the load current is limited to a predetermined maximum value. Very large power losses can occur in the switching element during such a linear operation. Loads of this kind are, for example, filament lamps, servomotors for accelerating masses, or DC/DC converters which draw high currents during the charging of input capacitors and the charging of output capacitors. Loads with non-linear starting currents therefore cause an additional load on the switching element that is limited to the duration of the starting cycle.

Advantageously, the switching element 110 comprises a power transistor. An alternate to this is a graded network of power resistors with bridging mechanical contacts. The switching element 110 or plurality of switching elements 110 must always be capable of limiting the output current smoothly or in steps.

Generally, account should be taken of loads that give rise to high inrush currents due to capacitive components or high disconnection voltages due to inductive components at the switching element. If the switching element 110 switches such types of loads, thermal loading of the switching element 110 occurs, which requires a necessary cooling period between two switching operations. The duration of the cooling period is determined, on the one hand, by the resulting thermal load and, on the other hand, by the specification of the switching element 110, as well as the cooling conditions. The thermal load can be determined from the switching losses and the transfer losses. Here, the thermal load capability of the switching element 110 and the cooling conditions are predetermined by the type of construction and the implementation of the electronic safety device.

A maximum frequency with which a load or branch load circuit can be switched is obtained from the necessary cooling time.

In order to maintain the thermal load of the switching element 110 within the permissible range, remote switching commands are blocked in accordance with the invention if a plant control system switches a load on and off too frequently. An increasing number of such cases should be assumed in complex plants with proprietary controllers in particular. Moreover, short project planning times are the rule in plant construction and, consequently, detailed calculation of all loads and therefore safe design of all switching elements, is not always possible.

In the simplest case, an electronic control unit 120 (for example, a microcontroller) in the safety device predetermines a fixed limit for the switching frequency. A fixed minimum cooling time between two switching cycles must therefore elapse. Should a switching command be received during a corresponding lock-out period, the electronic control unit 120 blocks this command and signals this to the master plant control system. At the same time, if necessary, the electronic safety device 100 is set up so that a blocked switching command is later executed on expiration of the lock-out period. In many plant configurations it can also be useful not to execute a blocked switching command anyway, and to signal this to the master controller.

A further embodiment makes provision for the number of switching operations per time unit to be limited. An accumulation of switching operations is accepted if followed by a correspondingly long cooling time. Here, for example, the thermal time constant of the switching element 110 is stored in an arithmetic algorithm. The thermal load is simply derived from the switching times and a maximum permissible limiting current of the safety device.

In an advantageous method for determining the maximum permissible switching frequency, the temperature of the switching element is used as a gage of the thermal reserve. This requires the temperature of the switching element 110 to be measured. If the power loss of the switching element is distributed by ohmic resistances, then these resistances must also be thermally monitored. A power transistor with built-in thermal signaling (for example, the Infineon company's Tempfet) is a more convenient choice. An additional built-in thyristor is triggered at a defined temperature limit, which results in a detectable variation of a voltage divider external to the power semiconductor. In this case, the electronic safety device 100 is set up so that switching commands are blocked when the temperature limit is reached.

For improved determination of the power loss of the switching element 110, the limiting time is measured, during which the switching element 110 is operating in the linear mode and executes an ON or OFF switching operation with a load. Assuming that there is a continuous rise and fall in the voltage at the load during linear operation, the maximum possible amount of energy loss per switching operation is derived from this limiting time. The determination of the thermal state of the switching element is realized by a thermal time constant which is either known or can be established in simple tests. A particular maximum switching frequency is therefore established for each load and specified to the electronic control unit 120 as a limiting value.

A further improvement is obtained by determining the actual losses occurring at the switching element 110 by measuring the current through the switching element 110 and the voltage applied to the switching element 110 over time. This allows the thermal situation to be calculated more or less exactly and to increase the performance capability of the electronic safety element. At the same time, it is useful to determine the power loss in each ON and OFF switching operation as accurately as possible and to include it in the calculation of the thermal situation. Consequently, in the case of switching cycles that occur at short intervals in succession, the thermal capacities of the power section are utilized and the acceptance of further switching commands is only suppressed in the event of imminent overload.

Figure 2:
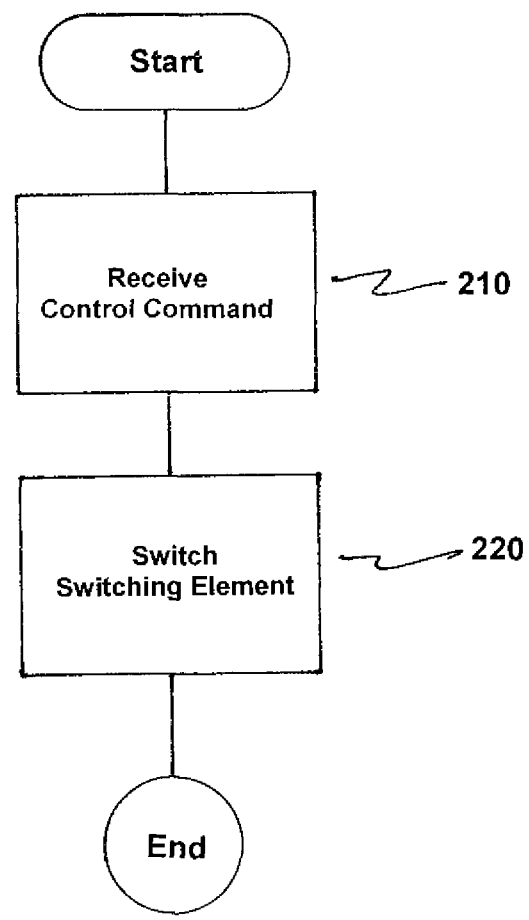
FIG. 2 is a flowchart in accordance with the method of the invention.

FIG. 2 is a flowchart of a method for operating an electronic safety device comprising a switching element at least one of disconnecting and limiting current consumption of an electrical load. The method comprises receiving control commands for the switching element via a remote control interface, as indicated in step 210. The switching element is then switched on or off only when a thermal load on the switching element is within a permissible limit, as indicated in step 220.

While there have been shown and described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for operating an electronic safety device comprising a switching element at least one of disconnecting and limiting current consumption of an electrical load, the method comprising the steps of:
   receiving control commands for the switching element via a remote control interface;
   switching on or off the switching element only when a thermal load on the switching element is within a permissible limit;
   generate an acknowledgment signal after each switching operation; and
   specifying a lock-out period, during which no further switching operation is performable, subsequent to at least one switching operation.

2. The method as claimed in claim 1, further comprising the step of:
   generating a message signal if a switching command is not acted upon.

3. The method as claimed in claim 1, further comprising the steps of:
   determining a thermal load of the switching element; and
   performing no switching operations if the thermal load reaches a critical limit.

4. The method as claimed in claim 3, wherein said step of determining the thermal load comprises measuring a temperature of the switching element.

5. The method as claimed in claim 3, wherein said step of determining the thermal load comprises calculating at least one of switching energy losses and transfer losses of the switching element.

6. The method as claimed in claim 5, further comprising the step of:
   measuring a voltage drop across the switching element and a current flowing through the switching element; and
   calculating the switching energy losses and transfer losses of the switching element from the measured voltage drop and current flow values.

7. The method as claimed in claim 3, further comprising the step of:
   specifying a cooling period during which no switching operations are performed according to an established thermal load.

8. The method as claimed in claim 1, further comprising:
   transmitting binary signals via the remote control interface.

9. An electronic safety device comprising:
   a switching element;
   an electronic control unit configured to trigger the switching element only when a thermal load of the switching element is within a permissible range and configured to generate an acknowledgement signal after each switching operation;
   a remote control interface configured to receive control commands for the switching element; and
   a timer for specifying a lock-out period during which no further switching operation is performable.

10. The electronic safety device as claimed in claim 9, wherein the electronic safety device is configured to determine the thermal load of the switching element.

11. The electronic safety device as claimed in claim 10, further comprising:
   microcontroller for calculating switching energy losses.

12. The electronic safety device as claimed in claim 9, further comprising:
   an operator control element for manually retrieving at least one function of the electrical safety device.

13. The electronic safety device as claimed in claim 9, wherein the remote control interface is further configured to connect to a daisy chain communications link for one of (i) relaying switching commands and messages to a plurality of safety devices and (ii) relaying switching commands and messages from a plurality of safety devices.

* * * * *